(12) United States Patent
Lee et al.

(10) Patent No.: US 8,279,095 B2
(45) Date of Patent: Oct. 2, 2012

(54) METHOD FOR STORING NODE INFORMATION OF HUFFMAN TREE AND CORRESPONDING DECODING METHOD

(75) Inventors: Chung-I Lee, Taipei Hsien (TW);
Chien-Fa Yeh, Taipei Hsien (TW);
Chiu-Hua Lu, Taipei Hsien (TW);
Cheng-Feng Tsai, Taipei Hsien (TW);
Shan-Chuan Jeng, Taipei Hsien (TW);
Yu-Feng Chien, Taipei Hsien (TW);
Tsung-Hsin Yen, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 127 days.

(21) Appl. No.: 12/881,134

(22) Filed: Sep. 13, 2010

(65) Prior Publication Data

US 2011/0285558 A1 Nov. 24, 2011

(30) Foreign Application Priority Data

May 19, 2010 (TW) ................................ 99115878 A

(51) Int. Cl.
*H03M 7/40* (2006.01)

(52) U.S. Cl. ................ 341/65; 341/67; 341/78; 341/79
(58) Field of Classification Search ................ 341/65, 341/79, 67, 78
See application file for complete search history.

(56) References Cited

U.S. PATENT DOCUMENTS

| 5,841,376 | A | * | 11/1998 | Hayashi | 341/51 |
| 6,012,061 | A | * | 1/2000 | Sharma | 1/1 |
| 6,154,156 | A | * | 11/2000 | Tagato | 341/79 |
| 6,535,150 | B1 | * | 3/2003 | Ross | 341/67 |
| 6,741,191 | B2 | * | 5/2004 | Jang et al. | 341/65 |
| 7,249,311 | B2 | * | 7/2007 | Lamy | 714/796 |
| 7,609,182 | B2 | * | 10/2009 | Owsley et al. | 341/65 |
| 7,990,297 | B1 | * | 8/2011 | Korodi et al. | 341/107 |
| 8,106,797 | B2 | * | 1/2012 | Owsley et al. | 341/67 |
| 2009/0144603 | A1 | * | 6/2009 | Owsley et al. | 714/786 |

* cited by examiner

*Primary Examiner* — Linh Nguyen
(74) *Attorney, Agent, or Firm* — Altis Law Group, Inc.

(57) ABSTRACT

A method for storing node information of a Huffman tree. The method creates an index of each node in the Huffman tree using a breadth first search (BFS) algorithm. The method further reads each node of the Huffman tree beginning from a root node according to a sequence of the index of each node, and stores node information of each node into an array of the Huffman tree.

8 Claims, 7 Drawing Sheets

| Return value | Code Length | Code |
|---|---|---|
| 0 | 2 | 11 (3) |
| 1 | 2 | 01 (1) |
| -1 | 2 | 00 (0) |
| 2 | 3 | 100 (4) |
| -2 | 4 | 1010 (11) |
| 3 | 5 | 10101 (21) |
| -3 | 5 | 10100 (20) |

METHOD FOR STORING NODE INFORMATION OF HUFFMAN TREE AND CORRESPONDING DECODING METHOD

BACKGROUND

1. Technical Field

Embodiments of the present disclosure relates to data encoding technology, and particularly to a method for storing node information of a Huffman tree and corresponding decoding method.

2. Description of Related Art

Currently, node information of each node in a Huffman tree is stored using a Huffman table. The node information of each node in the Huffman tree may include a return value, a code value, and a code length. The return value of each node may be obtained from the Huffman table according to a specified code value of encoded data when Huffman decoding is performed on the encoded data. However, the Huffman table occupies too much storage space because each node needs to store at least three kinds of values. Therefore, an efficient method for storing node information of the Huffman tree is desired.

BRIEF DESCRIPTION OF THE DRAWINGS

FIG. 3 is an example of a Huffman table for storing node information.

DETAILED DESCRIPTION

All of the processes described below may be embodied in, and fully automated by, functional code modules executed by one or more general purpose computers or processors. The code modules may be stored in any type of non-transitory readable medium or other storage device. Some or all of the methods may alternatively be embodied in specialized hardware. Depending on the embodiment, the non-transitory readable medium may be a hard disk drive, a compact disc, a digital video disc, or a tape drive.

Figure 1:
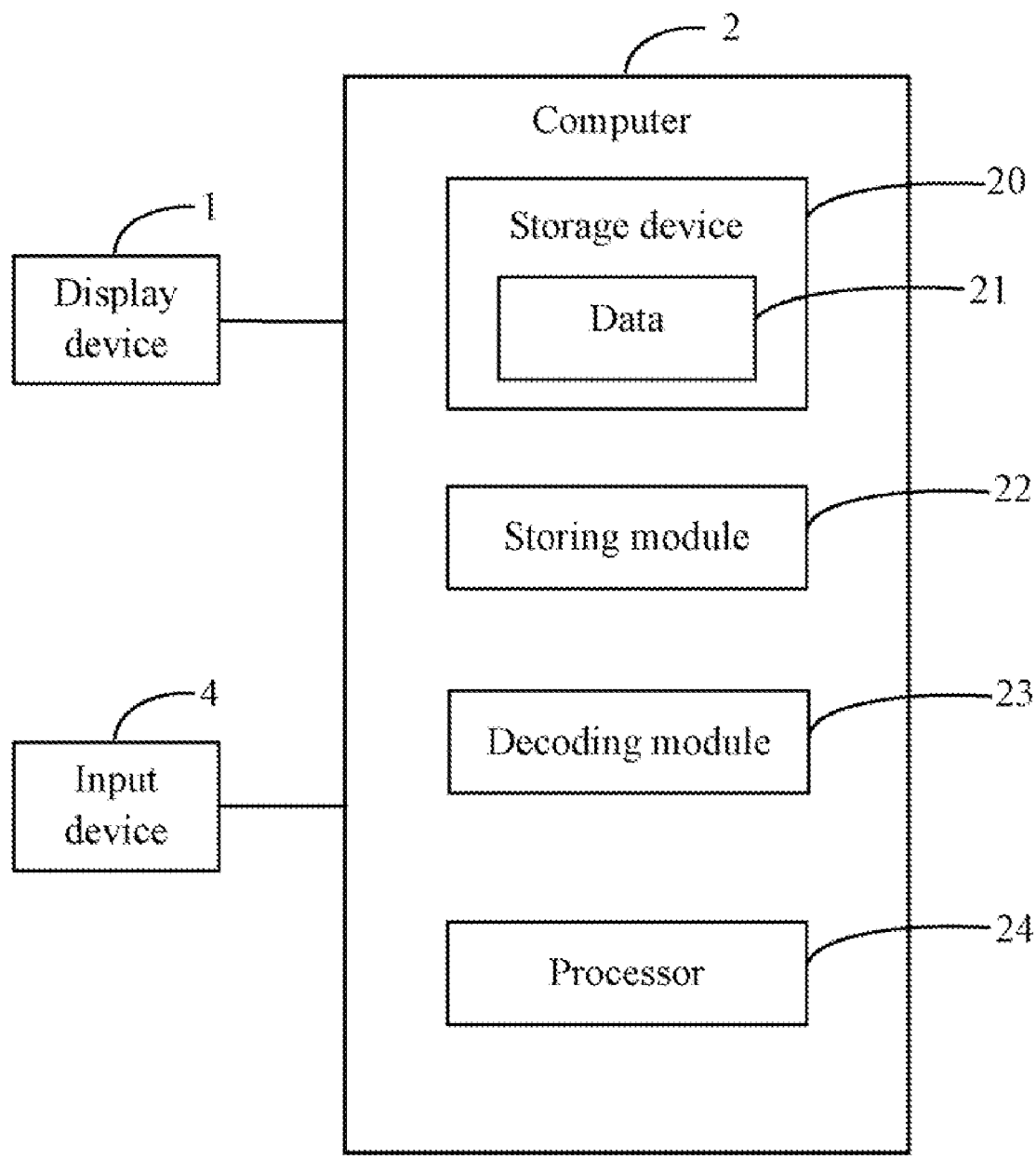
FIG. 1 is a schematic diagram of some embodiments of a computer.

FIG. 1 is a schematic diagram of some embodiments of a computer 2. In some embodiments, the computer 2 may include a storage device 20, a storing module 22, a decoding module 23, and a processor 24. The storage device 20 may be used to store data 21 (e.g., a bit stream) to be decoded. The storing module 22 may be used to store node information of a Huffman tree in an array of the Huffman tree, and the decoding module 23 may be used to decode the data 21 using the array of the Huffman tree. A detailed description will be given in the following paragraphs.

In some embodiments, the computer 2 is electronically connected to a display device 1 and an input device 4. Depending on the embodiment, the display device 1 may be a liquid crystal display (LCD) or a cathode ray tube (CRT) display, for example.

The input device 4 is provided for selecting a bit stream to be decoded by the decoding module 23. The selected bit stream may be displayed on the display device 1. In some embodiments, the input device 4 may be a keyboard, or a mouse.

In some embodiments, the storing module 22 and the decoding module 23 comprise one or more computerized instructions that are stored in the storage device 20. The computerized code includes instructions that are executed by the at least one processor 24 to provide functions for modules 22-23.

Figure 2:
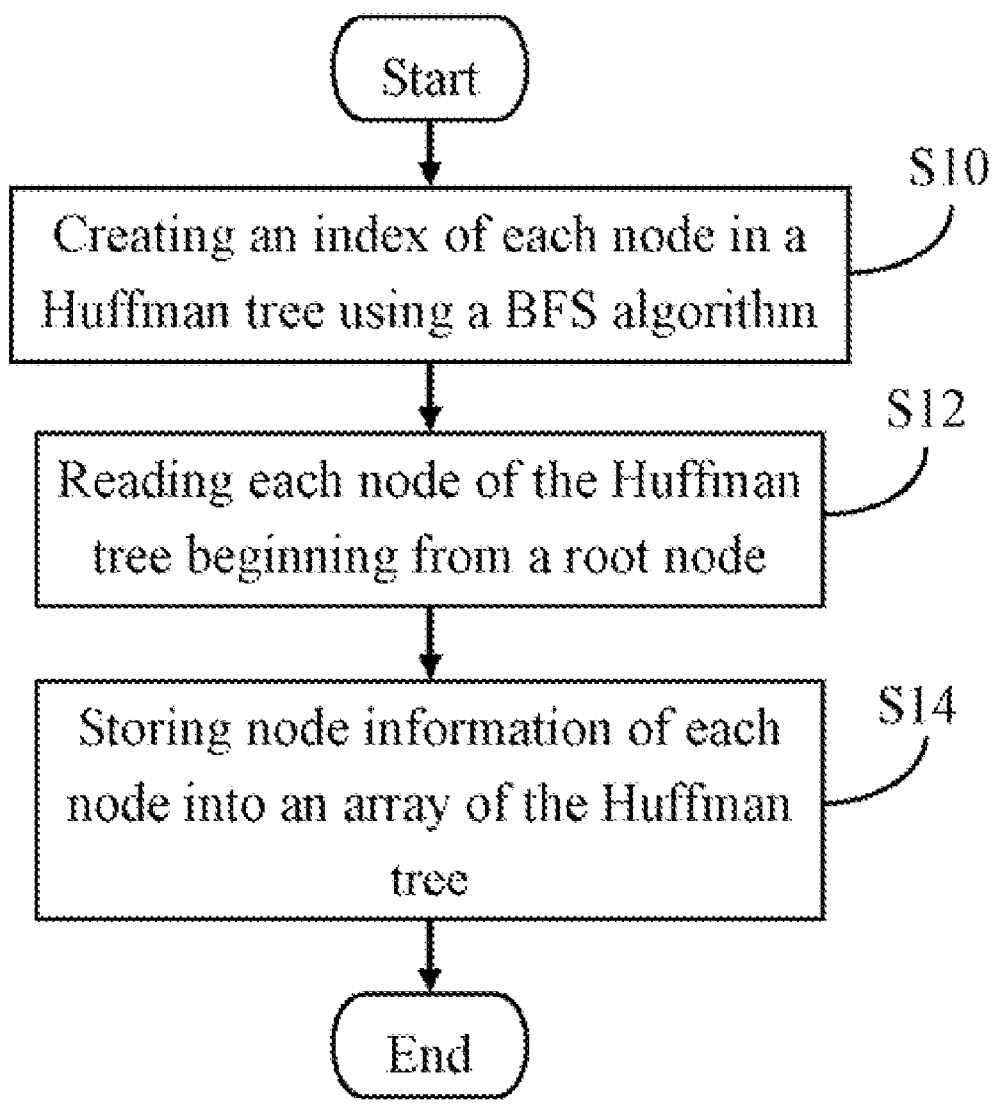
FIG. 2 is a flowchart of some embodiments of a method for storing node information of a Huffman tree.

FIG. 2 is a flowchart of some embodiments of a method for storing node information of a Huffman tree.

Figure 4:
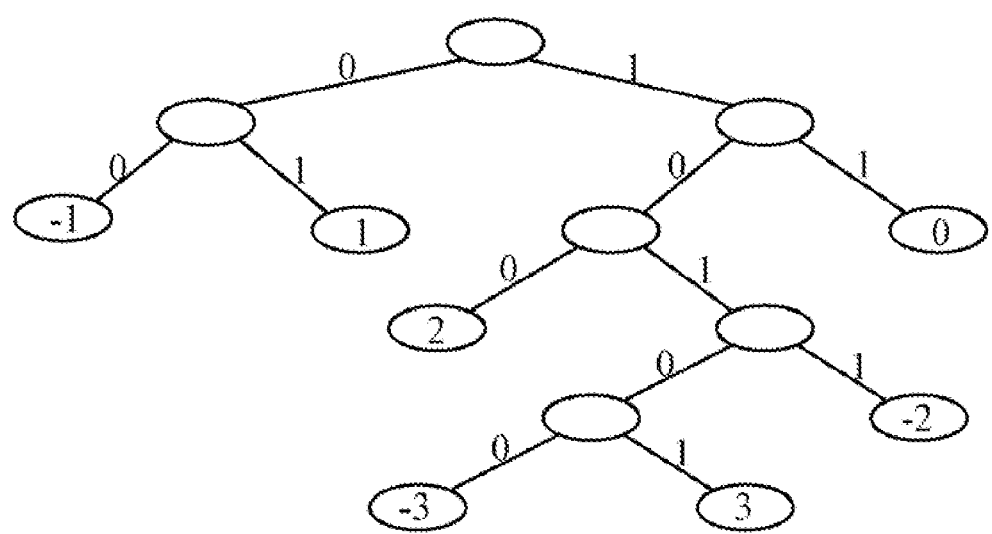
FIG. 4 is an example of a Huffman tree created from the Huffman table of FIG. 3.
Figure 5:
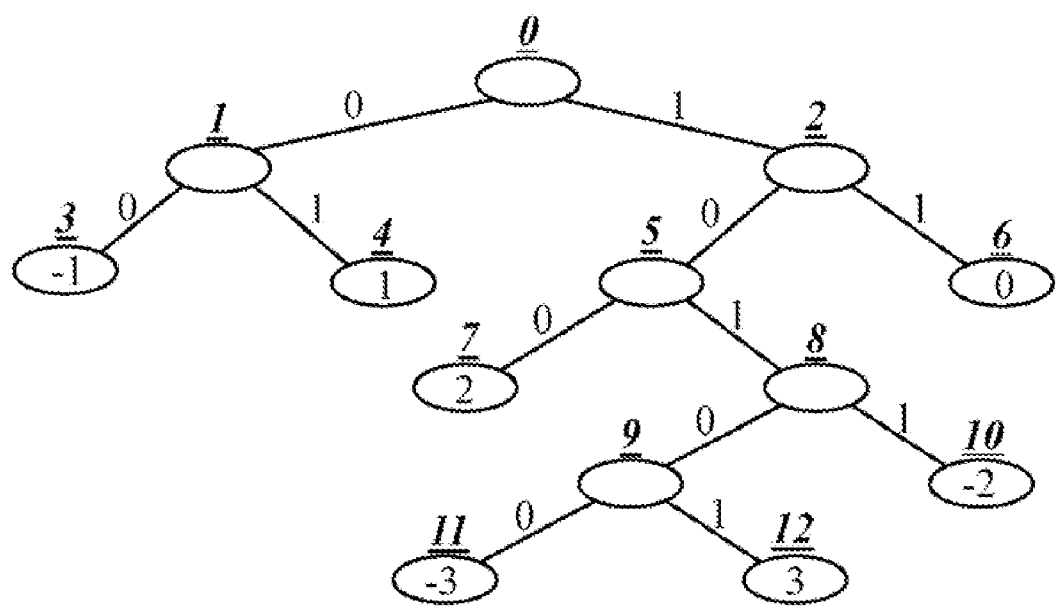
FIG. 5 is an example of creating an index for each node in the Huffman tree of FIG. 4.

In block S10, the storing module 22 creates an index of each node in the Huffman tree using a breadth first search (BFS) algorithm. For example, as shown in FIG. 4, a Huffman tree is created according to a Huffman table as shown in FIG. 3. FIG. 5 is a schematic diagram of the Huffman tree including a plurality of nodes having indexes. As shown in FIG. 5, the index of each node in the Huffman tree is located on the top of the node, and recorded with a specific form, for example, a bold and italic form, such as 0, 1, 2, 3, 4, 5, 6, 7, 8, 9, 10, 11, and 12.

In block S12, the storing module 22 reads each node of the Huffman tree beginning from a root node (i.e., the first node) according to a sequence of the index of each node. For example, the storing module reads each node of the Huffman tree according to an ascending order of the index of each node.

In block S14, the storing module 22 stores node information of each node into an array of the Huffman tree. In some embodiments, the storing module 22 stores the node information of each node with a first part and a second part into the array of the Huffman tree. Specifically, the storing module 22 divides the node information of each node in the Huffman tree into a first part "Value2" and a second part "LeafBit" (refer to part A of FIG. 6), and merges a binary number of a first value of the first part and a binary number of a second value of the second part of each node to acquire a merged binary number. The storing module 22 stores a decimal number of the merged binary number into the array of the Huffman tree. In some embodiments, the first value and the second value are decimal numbers.

In some embodiments, the first value of the first part and the second value of the second part of the node are determined by the following steps. The storing module 22 first determines if the node is an internal node or a leaf node of the Huffman tree. If the node is the internal node, the first value of the first part of the node is equal to a difference value between an index of a left child node of the node and an index of the node, and a second value of the second part of the node is "1." If the node is the leaf node, the first value of the first part of the node is equal to the return value of the node, and the second value of the second part of the node is "0." In some embodiments, a storage length of the first part of each node is 7 bits, and the storage length of the second part of each node is 1 bit.

For example, the array of the Huffman tree of FIG. 5 may be represented as follows: char Huffman_Array [13]={3, 5, 7, −2, 2, 5, 0, 4, 3, 5, −4, −6, 6}. As shown in FIG. 5, the return value of each node is in the range of [−3, 3]. The maximum difference between the index of the left child node of the node and the index of the node is three. Thus, the storage length of the first part and the second part of each node is equal to 3 bits (Value2)+1 bit (LeafBit)=4 bits. In some embodiments, the storage length of the first part and the second part of each node is allocated to be 8 bits (i.e., 1 byte).

Figure 6:
FIG. 6 is an example of a data structure for storing node information of the Huffman tree.
Figure 6:
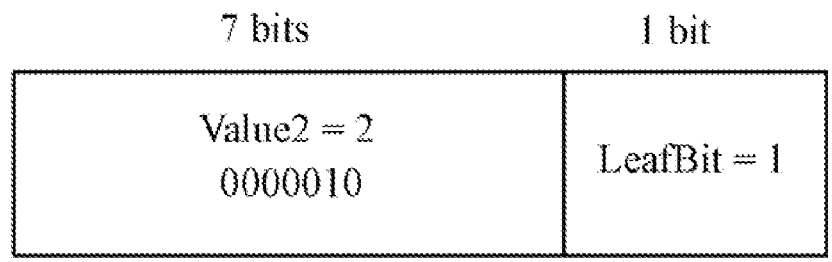
Figure 6:
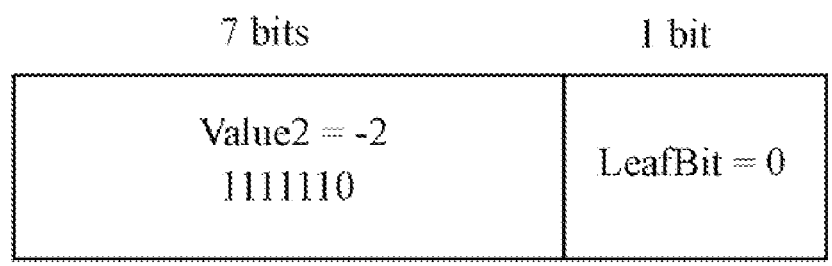

As shown in part B of FIG. 6, the node whose index equals to 5 is the internal node (hereinafter refer to as "node five"), the first value of the first part of node five=7−5=2= $(0000010)_2$, and the second value of the second part of node five is "1." Thus, the fifth element of the array of the Huffman tree is Huffman_Array[5]=5=$(00000101)_2$.

As shown in part C of FIG. 6, the node whose index equals to 10 is the leaf node (hereinafter refer to as "node ten"), the first value of the first part of node ten=−2=$(1111110)_2$, and the second value of the second part of node ten is "0." Thus, the tenth element of the array of the Huffman tree is Huffman_Array[10]=−4=$(11111100)_2$.

Figure 7:
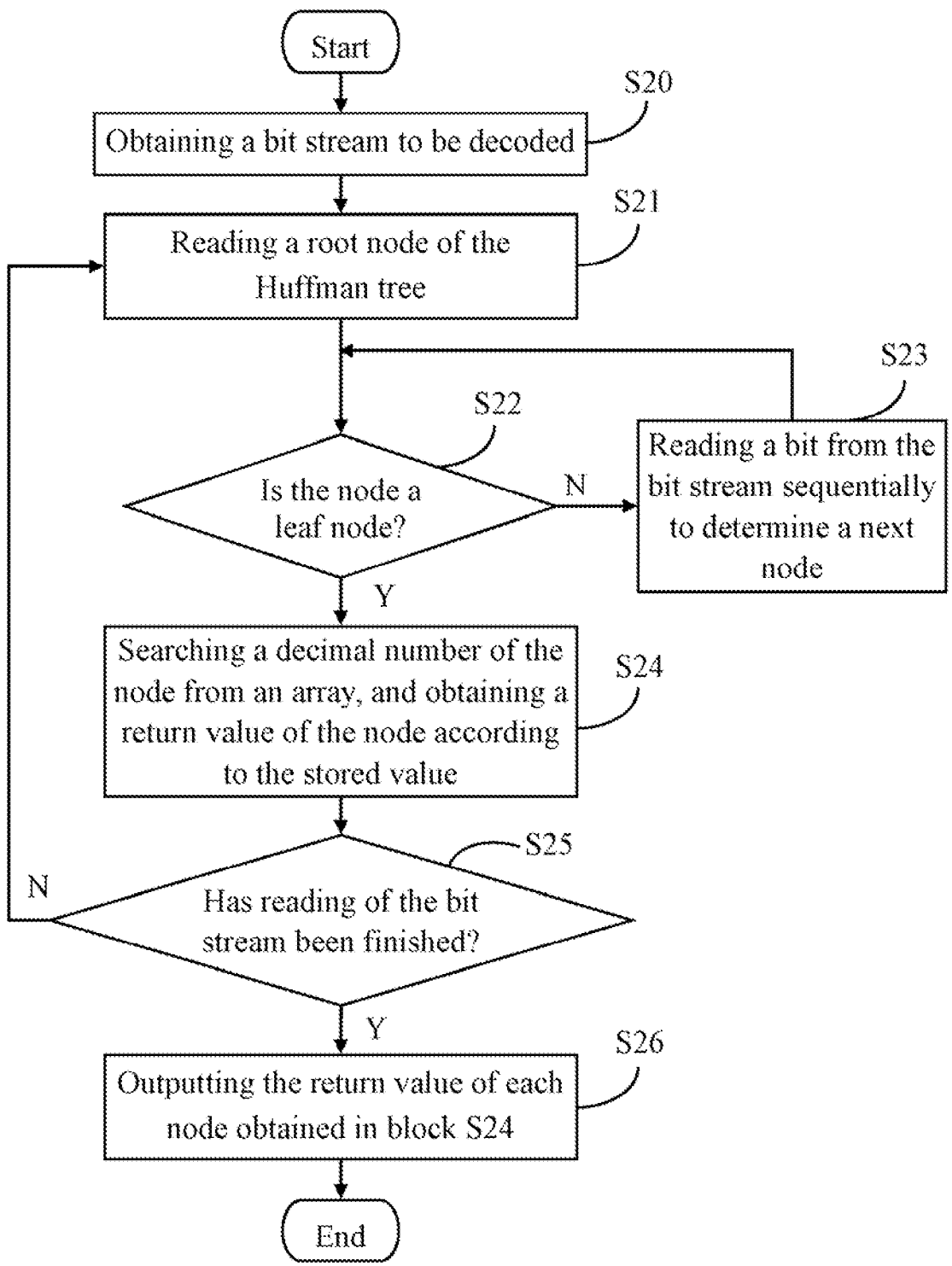
FIG. 7 is a flowchart of some embodiments of a method for decoding data using an array of the Huffman tree.

FIG. 7 is a flowchart of some embodiments of a method for decoding data using the array of the Huffman tree.

In block S20, the decoding module 23 obtains a bit stream to be decoded from the storage device 20.

In block S21, the decoding module 23 reads a root node (i.e., the first node) of the Huffman tree to decode the bit stream.

In block S22, the decoding module 23 determines if the node is a leaf node. The procedure goes to block S23 if the node is not the leaf node, or the procedure goes to block S24 if the node is a leaf node. Specifically, the decoding module 23 determines that the node is the internal node if the second value of second part of the node is "1," or determines that the node is the leaf node if the second value of second part of the node is "0."

In block S23, the decoding module 23 reads a bit from the bit stream sequentially to determine a next node in the Huffman tree, and the procedure returns to block S22 to determine if the next node is a leaf node. In some embodiments, the next node in the Huffman tree is determined by the following formulas. If the bit read from the bit stream is "0," the index of the next node is equal to (the index of a current node+the first value of the first part of the current node). If the bit read from the bit stream is "1," the index of the next node is equal to (the index of the current node+the first value of the first part of the current node+1).

In block S24, the decoding module 23 searches a decimal number of the node from the array of the Huffman tree according to an index of the node, and obtains the return value of the node from the decimal number of the node. In some embodiments, the return value of the node is equal to the first value of the first part of the node. Specifically, the first value of the first part of the node is determined by the following steps. The decoding module 23 converts the decimal number of the node to the binary number, and performs a right arithmetic shift operation on the binary number by 1 bit to obtain a right-shifted binary number. The decoding module 23 converts the right-shifted binary number to the decimal number to obtain the first value of the first part of the node.

In block S25, the decoding module 23 determines if reading of the bit stream has been finished. The procedure returns to block S21 if reading of the bit stream has not been finished. Otherwise, the procedure goes to block S26 if reading of the bit stream has been finished.

In block S26, the decoding module 23 outputs the return value of each node to generate a decoded bit stream.

An example of decoding a bit stream of "0101000110110111" using the array of the Huffman tree of FIG. 5 is provided as follows. The array of the Huffman tree of FIG. 5 may be "char Huffman_Array [13]={3, 5, 7, −2, 2, 5, 0, 4, 3, 5, −4, −6, 6}."

In step 1, the decoding module 23 reads a node of the Huffman tree began from the root node. The index of the root node is "0."

In step 2, the decoding module 23 determines if the node is the leaf node. Because a last bit of the binary number of Huffman_Array[0] is "1," thus, the node is not the leaf node.

In step 3, the decoding module 23 reads a bit from the bit stream of "0101000110110111" sequentially. Because the first bit is "0," the index of the next node=(0+(Huffman_Array[0]>>1))=(0+1)=1. "Huffman_Array[i]>>1" represents the first value of the first part of the node whose index is "i."

In step 4, the decoding module 23 determines if the node whose index equals to 1 is the leaf node. Because the last bit of the binary number of Huffman_Array[1] is "1," the node is not the leaf node.

In step 5, the decoding module 23 reads a subsequent bit from the bit stream of "0101000110110111" sequentially. Because the subsequent bit is "1," the index of the next node= (1+(Huffman_Array[1]>>1)+1)=(1+2+1)=4. Thus, the next node is the fourth element of Huffman_Array[4].

In step 6, the decoding module 23 determines if the node whose index equals to 4 is the leaf node. Because the last bit of the binary number of Huffman_Array[4] is "0," that is, the node is the leaf node. Thus, the decoding module 23 obtains the return value of the node whose index equals to 4, and the return value=Huffman_Array[4]>>1=1.

In step 7, the decoding module 23 repeats the steps 1-6 to decode the remain bits of the bit stream (i.e., 0101000110110111, the underlined bits) until reading of the bit stream has been finished. Thus, the decoding module 23 may obtain the decoded bit stream of {1, 1, −1, 1, −2, 0}.

It should be emphasized that the above-described embodiments of the present disclosure, particularly, any embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A method for storing node information of a Huffman tree, the method comprising:
   creating an index of each node in the Huffman tree using a breadth first search (BFS) algorithm, each node comprising a return value;
   reading each node of the Huffman tree beginning from a root node according to a sequence of the index of each node; and
   storing node information of each node into an array of the Huffman tree, the node information of each node being stored with a first part and a second part into the array of the Huffman tree, the second part being used to determine if the node is an internal node or a leaf node of the Huffman tree.

2. The method according to claim 1, wherein the step of storing node information of each node into an array of the Huffman tree comprises:
   dividing the node information of each node in the Huffman tree into the first part and the second part;
   merging a binary number of a first value of the first part and a binary number of a second value of the second part of each node to acquire a merged binary number, the first value and the second value being decimal numbers;
   storing a decimal number of the merged binary number into the array of the Huffman tree.

3. The method according to claim 2, wherein the first value of the first part and the second value of the second part of the node are determined by:
  determining if the node is an internal node or a leaf node of the Huffman tree;
  determining that a first value of the first part of the node is equal to a difference value between an index of a left child node of the node and an index of the node if the node is the internal node, and a second value of the second part of the node is "1;" or
  determining that the first value of the first part of the node is equal to the return value of the node if the node is the leaf node, and the second value of the second part of the node is "0."

4. The method according to claim 2, wherein a storage length of the first part of each node is 7 bits, and the storage length of the second part of each node is 1 bit.

5. A non-transitory storage medium having stored thereon instructions that, when executed by a processor of a computer, causes the processor to perform a method for storing node information of a Huffman tree, the method comprising:
  creating an index of each node in the Huffman tree using a breadth first search (BFS) algorithm, each node comprising a return value;
  reading each node of the Huffman tree beginning from a root node according to a sequence of the index of each node; and
  storing node information of each node into an array of the Huffman tree, the node information of each node being stored with a first part and a second part into the array of the Huffman tree, the second part being used to determine if the node is an internal node or a leaf node of the Huffman tree.

6. The non-transitory storage medium according to claim 5, wherein the step of storing node information of each node into an array of the Huffman tree comprises:
  dividing the node information of each node in the Huffman tree into a first part and a second part;
  merging a binary number of a first value of the first part and a binary number of a second value of the second part of each node to acquire a merged binary number, the first value and the second value being decimal numbers;
  storing a decimal number of the merged binary number into the array of the Huffman tree.

7. The non-transitory storage medium according to claim 6, wherein the first value of the first part and the second value of the second part of the node are determined by:
  determining if the node is an internal node or a leaf node of the Huffman tree;
  determining that a first value of the first part of the node is equal to a difference value between an index of a left child node of the node and an index of the node if the node is the internal node, and a second value of the second part of the node is "1;" or
  determining that the first value of the first part of the node is equal to the return value of the node if the node is the leaf node, and the second value of the second part of the node is "0."

8. The non-transitory storage medium according to claim 6, wherein a storage length of the first part of each node is 7 bits, and the storage length of the second part of each node is 1 bit.

\* \* \* \* \*